(12) United States Patent
Park et al.

(10) Patent No.: US 8,735,239 B2
(45) Date of Patent: May 27, 2014

(54) SEMICONDUCTOR DEVICES INCLUDING COMPRESSIVE STRESS PATTERNS AND METHODS OF FABRICATING THE SAME

(75) Inventors: Sangjine Park, Yongin-si (KR); Young Suk Jung, Seongnam-si (KR); Boun Yoon, Seoul (KR); Jeongman Han, Seoul (KR); Byung-Kwon Cho, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 330 days.

(21) Appl. No.: 13/197,133

(22) Filed: Aug. 3, 2011

(65) Prior Publication Data

US 2012/0094459 A1    Apr. 19, 2012

(30) Foreign Application Priority Data

Oct. 13, 2010 (KR) .......................... 10-2010-0099956

(51) Int. Cl.

| H01L 21/8238 | (2006.01) |
| H01L 21/336 | (2006.01) |
| H01L 27/10 | (2006.01) |
| H01L 29/80 | (2006.01) |

(52) U.S. Cl.
USPC ........... 438/199; 438/230; 438/283; 438/299; 438/303; 257/206; 257/274; 257/369

(58) Field of Classification Search
USPC ................. 438/199, 230, 283, 299, 300, 303; 257/202, 204, 206, 274, 351, 369, 371, 257/396
See application file for complete search history.

(56) References Cited

U.S. PATENT DOCUMENTS

| 7,405,131 B2 * | 7/2008 | Chong et al. .................. 438/300 |
| 7,939,413 B2 * | 5/2011 | Chong et al. .................. 438/300 |
| 2008/0087967 A1 | 4/2008 | Kim |
| 2009/0026504 A1 | 1/2009 | Okuda et al. |
| 2009/0101979 A1 | 4/2009 | Kim et al. |
| 2009/0302395 A1 * | 12/2009 | Ohta ............................. 257/369 |
| 2010/0052074 A1 * | 3/2010 | Lin et al. ....................... 257/407 |
| 2011/0070703 A1 * | 3/2011 | Xiong et al. .................. 438/231 |

FOREIGN PATENT DOCUMENTS

| KR | 1020080032926 A | 4/2008 |
| KR | 1020090039584 A | 4/2009 |
| WO | WO 2007/077748 | 7/2007 |

* cited by examiner

*Primary Examiner* — Hsien Ming Lee
(74) *Attorney, Agent, or Firm* — Myers Bigel Sibley & Sajovec, P.A.

(57) ABSTRACT

Provided is a method of fabricating a semiconductor device. Gate patterns are formed on a substrate including an NMOS transistor region and a PMOS transistor region. A spacer structure is formed on sidewalls of the gate patterns. The substrate in the PMOS transistor region is etched using the gate patterns and the spacer structure as etching masks, and thereby a recessed region is formed. A compressive stress pattern is formed in the recessed region, and a sidewall of the compressive stress pattern protrudes upwardly from an upper surface of the substrate. A mask oxide layer is formed on a sidewall of the spacer structure. The mask oxide layer is formed to cover a portion of the sidewall of the compressive stress pattern that protrudes upwardly from the upper surface of the substrate.

13 Claims, 9 Drawing Sheets

SEMICONDUCTOR DEVICES INCLUDING COMPRESSIVE STRESS PATTERNS AND METHODS OF FABRICATING THE SAME

CROSS-REFERENCE TO RELATED APPLICATIONS

This U.S. non-provisional patent application claims priority under 35 U.S.C. §119 of Korean Patent Application No. 10-2010-0099956, filed on Oct. 13, 2010, the entire contents of which are hereby incorporated by reference.

BACKGROUND

The present disclosure relates to semiconductor devices and methods of fabricating semiconductor devices. Semiconductor devices are very attractive in the electronic industry because of the small size, multi-functional characteristics and/or low cost. Semiconductor devices may be categorized as semiconductor memory devices having a memory element that stores data, semiconductor logic devices having a logic element that processes data, and hybrid semiconductor devices having both a memory element and a logic element.

As the electronic industry becomes more developed, requirements for diverse characteristics of semiconductor devices have been increased. For example, requirements of high reliability, high speed, and/or multi-functional characteristics are increasing. For satisfying these requirements, the inner structure of the semiconductor device is becoming more complex. It is therefore desirable to increase the integration density of semiconductor devices.

SUMMARY

The present disclosure provides semiconductor memory devices having improved electrical characteristics, and methods of fabricating the same.

Example embodiments provide methods of fabricating a semiconductor device including forming gate patterns on a substrate including an NMOS transistor region and a PMOS transistor region, forming a spacer structure on sidewalls of the gate patterns, etching the substrate in the PMOS transistor region using the gate patterns and the spacer structure as etching masks, thereby forming a recessed region, forming a compressive stress pattern in the recessed region, a portion of a sidewall of the compressive stress pattern protruding upwardly from a upper surface of the substrate, and forming a mask oxide layer on a sidewall of the spacer structure, wherein the mask oxide layer is formed to cover the protruded sidewall of the compressive stress pattern.

According to some embodiments of the inventive concept, a semiconductor device includes a substrate including an NMOS transistor region and a PMOS transistor region, gate patterns on the substrate; a spacer structure on sidewalls of the gate patterns, a tensile stress pattern covering the spacer structure in the NMOS transistor region, and a compressive stress pattern in the substrate of the PMOS transistor region. The spacer structure includes a first nitride layer, and the first nitride layer in the PMOS transistor region contacts the compressive stress pattern.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF THE EMBODIMENTS

The above objects, other objects, features and advantages of the present invention will be better understood from the following description of preferred embodiments taken in conjunction with the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

In the specification, it will be understood that when a layer (or film) is referred to as being 'on' another layer or substrate, it can be directly on the other layer or substrate, or intervening layers may also be present. In the drawings, the dimensions of layers and regions are exaggerated for clarity of illustration. Also, though terms like a first, a second, and a third are used to describe various regions and layers in various embodiments of the present invention, the regions and the layers are not limited to these terms. These terms are used only to discriminate one region or layer from another region or layer. Therefore, a layer referred to as a first layer in one embodiment can be referred to as a second layer in another embodiment. An embodiment described and exemplified herein includes a complementary embodiment thereof. As used herein, the term 'and/or' includes any and all combinations of one or more of the associated listed items. Like reference numerals refer to like elements throughout.

Figure 14:
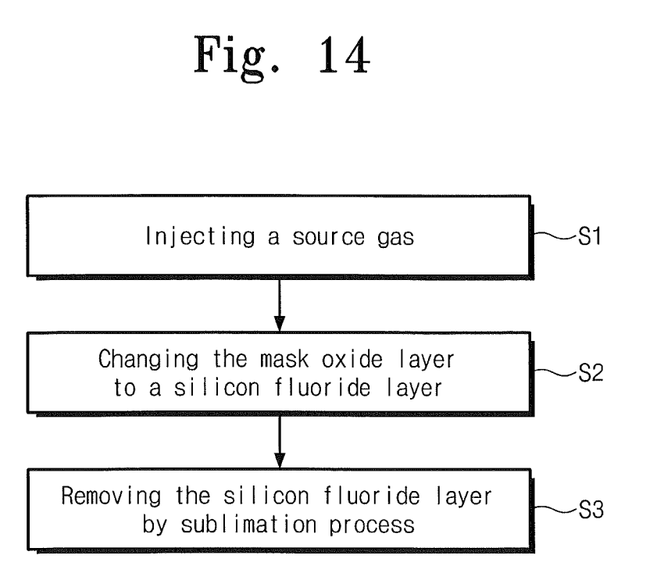
FIG. 14 is a flow chart illustrating methods fabricating the semiconductor device according to embodiments of the present inventive concept.

FIG. 1 through 12 are cross-sectional views illustrating a semiconductor device and methods of fabricating the semiconductor device according some embodiments of the present inventive concept. FIG. 14 is a flow chart illustrating methods fabricating the semiconductor device according to embodiments of the present inventive concept.

Figure 1:
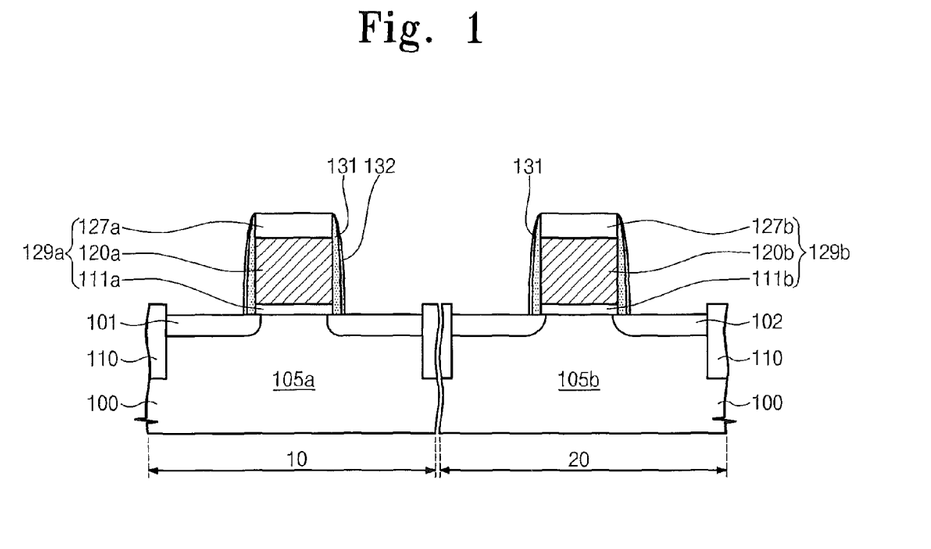
FIG. 1 through 12 are cross-sectional views illustrating a semiconductor device and method of fabricating the semiconductor device according the first embodiment of the present inventive concept.

Referring to FIG. 1, a substrate 100 including a first transistor region 10 and a second transistor region 20 may be provided. The substrate 100 is a substrate including a semiconductor material. For example, the substrate 100 may be a silicon substrate, germanium substrate, silicon-germanium substrate, silicon on insulator substrate, etc. The first transistor region 10 may be an NMOS transistor region, the second transistor region 20 may be a PMOS transistor region. A first active portion 105a of the first transistor region 10 and a second active portion 105b of the second transistor region 20 may be defined by forming a device isolation pattern 110 in the substrate 100. The device isolation pattern 110 may be formed by a shallow trench isolation process. For example, the device isolation pattern 110 may fill the trench formed in the substrate 100. The first active portion 105a may be doped with a first conductive type impurity, the second active portion 105b may be doped with a second conductive type impurity. For example, the first conductive type impurity may be a p-type impurity, the second conductive type impurity may be an n-type impurity.

Dummy gate patterns may be formed on the substrate 100. A first dummy gate pattern 129a may be formed in the first transistor region 10, the second dummy gate pattern 129b may be formed in the second transistor region 20. The first dummy gate pattern 129a may include a first gate dielectric pattern 111a, a first dummy gate electrode 120a on the first dielectric pattern 111a, and a first dummy hard mask pattern 127a on the first dummy gate electrode 120a. The second dummy gate pattern 129b may include a second gate dielectric pattern 111b, a second dummy gate electrode 120b on the second dielectric pattern 111b, and a second dummy hard mask pattern 127b on the second dummy gate electrode 120b. The first and second dummy gate patterns 129a, 129b may be formed simultaneously. For example, after forming a gate dielectric layer (not shown) and a dummy gate electrode layer (not shown) on the substrate 100, the gate dielectric layer and the dummy gate electrode layer may be patterned using the first and second dummy hard mask pattern 127a, 127b as an etch mask. The gate dielectric layer may include a plurality of dielectric layers. For example, the gate dielectric layer may include one or more of a hafnium oxide (HfOx) layer, a tantalum oxide (TaOx) layer having a high dielectric constant, and/or a silicon oxide (SiO2) layer. The gate dielectric layer may be formed by a process, such as chemical vapor deposition (CVD), atomic layer deposition (ALD), and/or rapid thermal processing (RTP). The dummy gate electrode layer may include a poly-silicon. The dummy gate electrode layer may be formed by CVD.

A first spacer 131 and a second spacer 132 may be formed sequentially on both of the first and second dummy gate patterns 129a, 129b. The first spacer 131 may be silicon nitride layer, and the second spacer 132 may be silicon oxide layer. The first spacer 131 may be formed by dry etch using plasma having a strong directivity after forming a silicon nitride layer on the first and second dummy gate patterns 129a, 129b. A portion of the silicon nitride layer may remain on sidewalls of the first and second dummy gate patterns 129a, 129b after the dry etch process. The second spacer 132 may be formed by dry etch using plasma after forming a silicon oxide layer on the first spacer 131. In some embodiments, the second spacer 132 may be formed by ashing process after the first spacer 131 is formed.

A first source/drain extension portion 101 may be foamed in the first active portion 105a, a second source/drain extension portion 102 may be formed in the second active portion 105b by using the first and second spacers 131, 132 as an ion implantation mask. The first and second source/drain extension portions 101, 102 are impurity regions having different conductive types relative to one another. For example, the first source/drain extension portion 101 may be an impurity region doped with the n-type dopant while the first transistor region 10 is an NMOS transistor region, the second source/drain extension portion 102 may be an impurity region doped with the p-type dopant while the second transistor region 20 is a PMOS transistor region.

Figure 2:
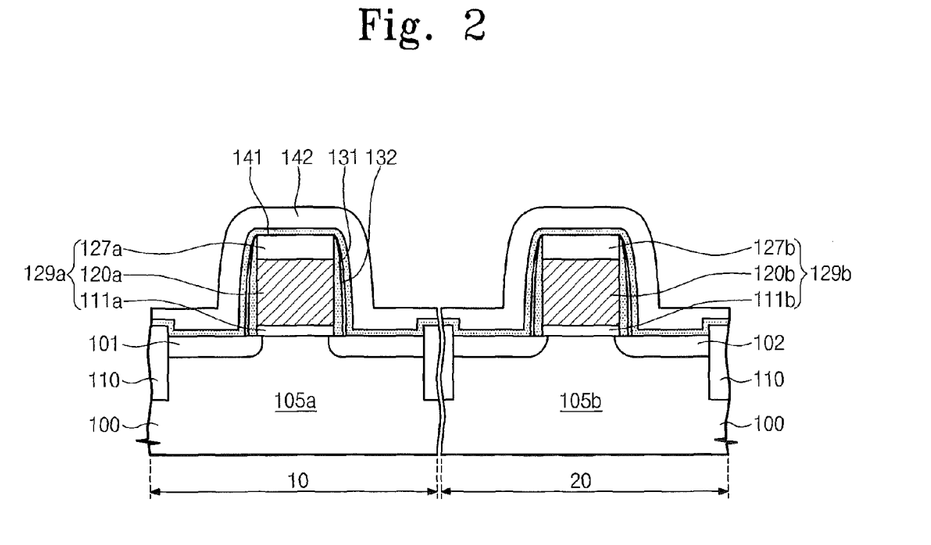
Figure 3:
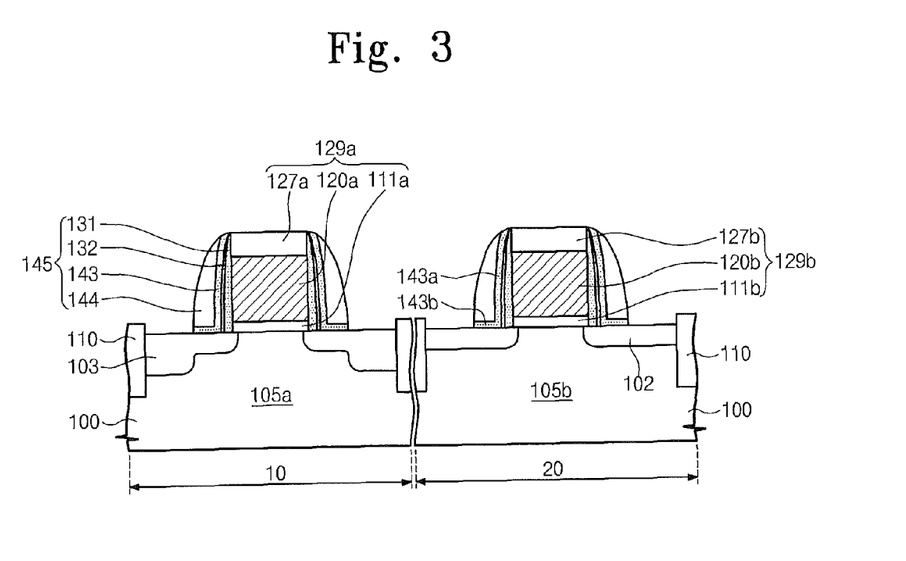

Referring to FIG. 2 and FIG. 3, a third spacer 143 and a fourth spacer 144 may be formed on the substrate 100. The third spacer 143 may include a material having an etching selectivity to the fourth spacer 144. For example, the third spacer 143 and the fourth spacer 144 are silicon nitride layer and silicon oxide layer respectively. The third and fourth spacers 143, 144 may be formed, for example, by dry etch using plasma having a strong directivity after forming a silicon nitride layer 141 and a silicon oxide layer 142 sequentially on both of the first and second dummy gate patterns 129a, 129b. The third and the fourth spacers 143, 144 may be formed on the second spacer 132 by the etching process. The first to fourth spacers 131, 132, 143 and 144 may be a portion of a spacer structure 145. The spacer structure 145 may be formed on both of the first and second dummy gate patterns 129a, 129b. The third spacer 143 includes a sidewall portion 143a extended along the sidewall of the dummy gate patterns 129a, 129b, and a bottom portion 143b extended along the upper surface of the substrate 100. In other words, a cross-section of the third spacer 143 may be a "L" shape. Moreover, the third spacer 143 may be extended along a sidewall and a bottom surface of the fourth spacer 144. As described below, the third spacer 143 may protect the active portions 105a, 105b when a contact hole is misaligned. A first source/drain region 103 may be formed by using the first to fourth spacers 131, 132, 143 and 144 as an ion implantation mask. The first source/drain region 103 may be formed at a higher dose and/or higher implantation energy than the first source/drain extension portion 101.

Figure 4:
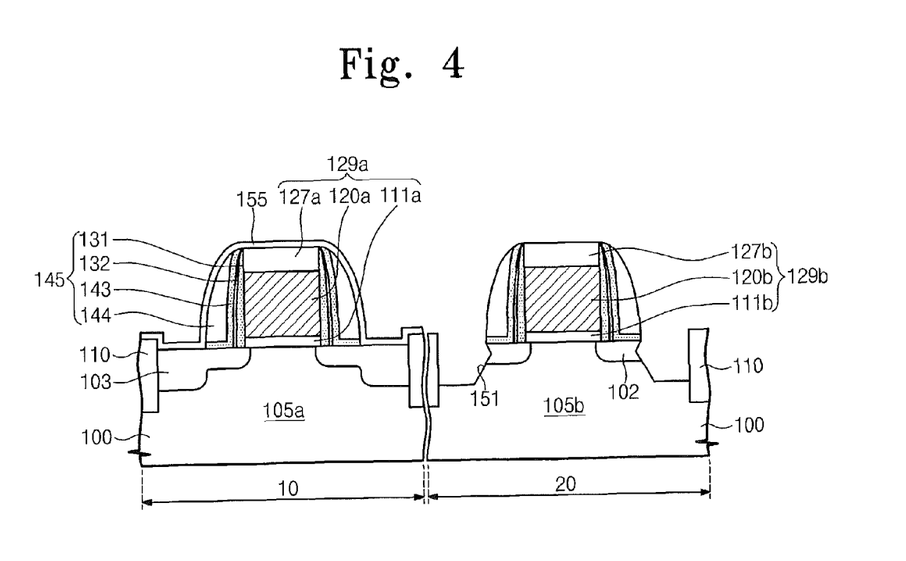

Referring to FIG. 4, an epitaxial growth retarding layer 155 may be formed on the NMOS and PMOS transistor regions, and patterned to expose the second active portion 105b. The epitaxial growth retarding layer 155 may be silicon nitride layer or silicon oxynitride layer. A recessed region 151 may be formed by etching the exposed portion of the second active portion 105b. The recessed region 151 may be formed by wet etching process having directivity. The wet etching process having directivity may use selected crystal planes among the crystal planes of the substrate 100 as an etch stop surface. For example, the wet etching process may use a {111} crystal planes of the substrate 100 as an etch stop surface. Therefore, a vertical cross section of the recessed region 151 may be tapered toward the channel region below the dummy gate pattern 129b. That is, an upper sidewall and a lower sidewall formed in the substrate 100 defining the recessed region 151 may cross each other below the spacer structure 145. The wet etching process may use etchant having directivity including ammonia and/or tetramethyl-ammonium hydroxide TMAH, etc when the substrate 100 is silicon substrate. The spacer structure 145 may be used as an etch mask.

In other embodiment, the recessed region 151 may be formed by an anisotropic dry etch using an etching gas having a directivity in a predetermined direction. For example, the dry etch process includes an etching process using an etching gas having a directivity in a direction having an acute angle to the direction perpendicular to the substrate 100. In this case, the device isolation pattern 110 and the spacer structure 145 may be used as an etch mask. The shape of the recessed region formed in this process may be different from the recessed region 151 shown in the FIG. 4. For example, the recessed region formed by the dry etching may not have a tapered sidewall shown in FIG. 4.

Figure 5:
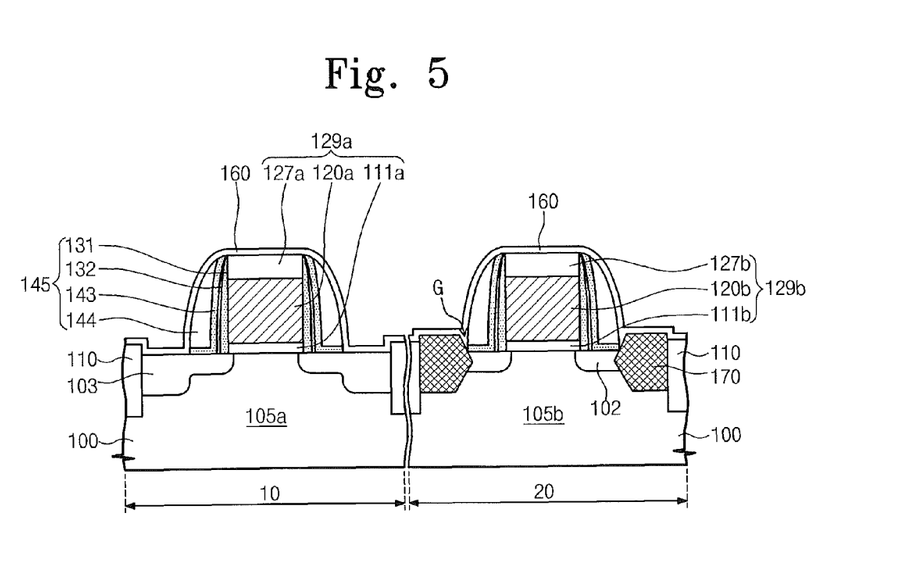
Figure 6:
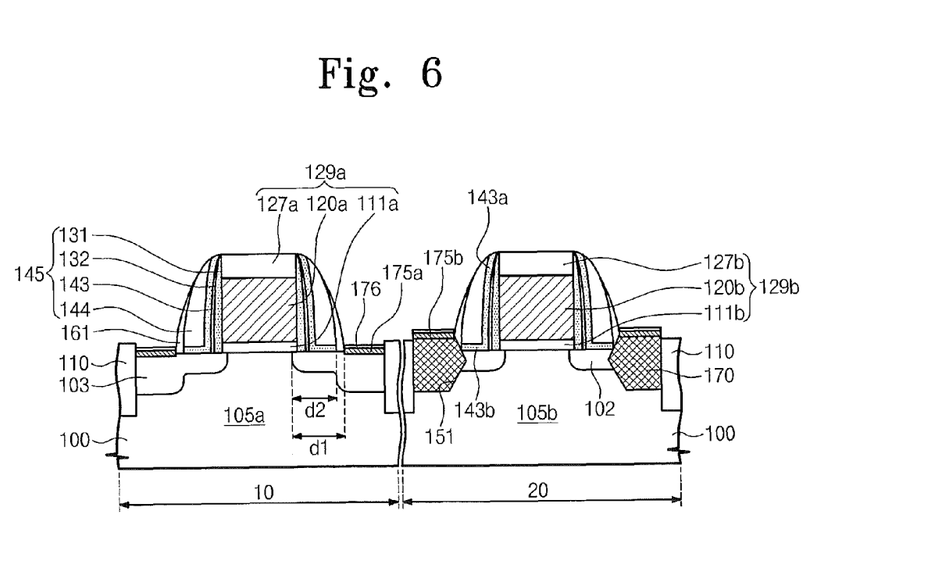

Referring to FIG. 5 and FIG. 6, a compressive stress pattern 170 filling the recessed region 151 may be formed. The compressive stress pattern 170 may be formed by performing a selective epitaxial growth in the recessed region 151. As the first transistor region 10 is covered by the epitaxial growth retarding layer 155 shown in FIG. 4, the compressive stress pattern 170 may not be formed on the first active portion 105a. The compressive stress pattern 170 may be a silicon-germanium layer when the substrate 100 is a silicon substrate.

The compressive stress pattern 170 may be a crystal structure. For example, the compressive stress pattern 170 may be a single crystal.

In some embodiments, the compressive stress pattern 170 may be doped with the first conductive type impurity by in-situ doping. In other embodiments, the compressive stress pattern 170 may be doped with the first conductive type impurity by an ion implantation process. The epitaxial growth retarding layer 155 may be removed after the compressive stress pattern 170 is formed. The compressive stress pattern 170 may increase carrier mobility of a channel region in the second transistor region 20.

Figure 13:
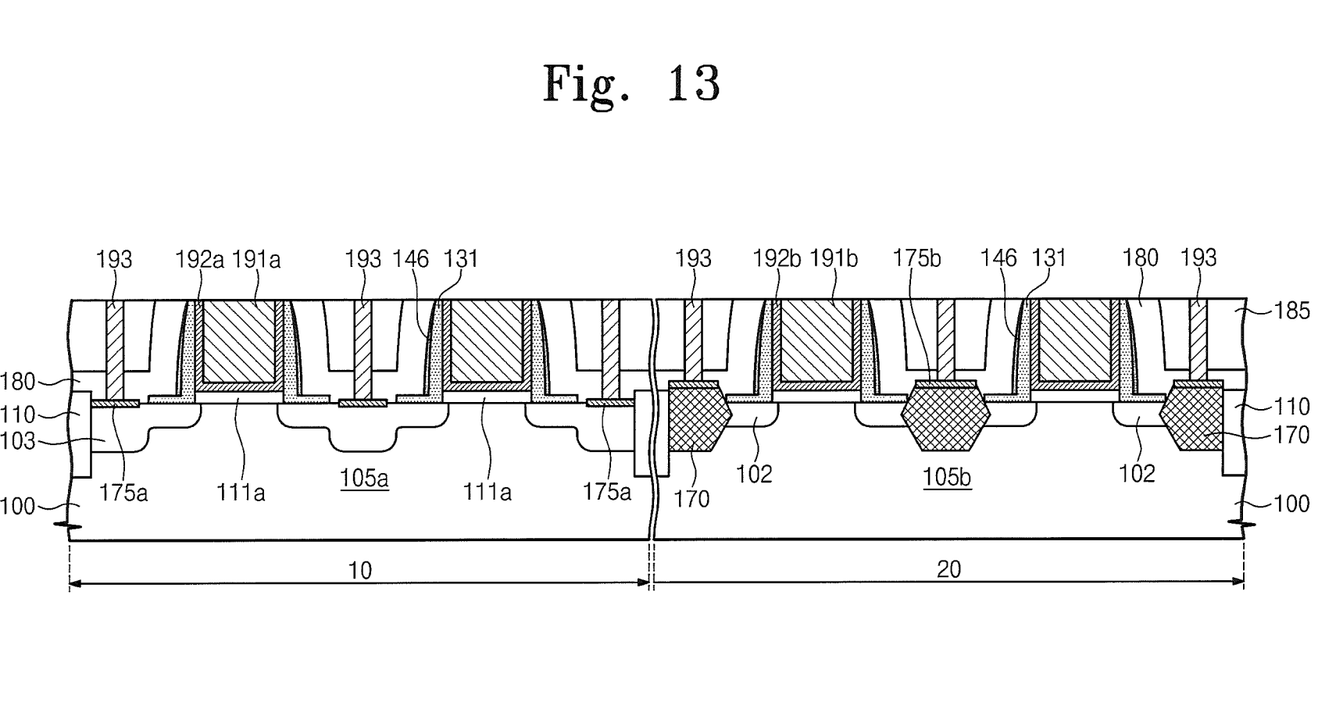
FIG. 13 is a cross-sectional view illustrating a semiconductor device and method of fabricating the semiconductor device according to the second embodiment of the present inventive concept.

The compressive stress pattern 170 may be grown higher than the upper surface of the substrate 100. That is, an upper surface of the compressive stress pattern 170 may be higher than the upper surface of the substrate 100. Consequently, a portion of the sidewall of the compressive stress pattern 170 may protrude upwardly from the upper surface of the substrate 100. The protruded portion of the sidewall of the compressive stress pattern 170 may be extended along the upper sidewall of the recessed region 151. The compressive stress pattern 170 may maintain a crystallographic direction while growing upwardly from the bottom of the recessed region 151. The compressive stress pattern 170 shown in FIG. 5 is illustrated as having a pentagonal shape in vertical cross section because of the interference of the device isolation pattern 110. However, it may have a hexagonal cross section as shown in FIG. 13 when the interference of the device isolation pattern 110 is not present. When the compressive stress pattern 110 has a structure as described above, a gap region G may be formed between the upper portion of the compressive stress pattern 170 and the spacer structure 145, because a sidewall of the protruded portion of the compressive stress pattern 170 has a slope. The slope may be declined from the upper surface of the compressive stress pattern 170 toward the second gate pattern 129b. When a metal-semiconductor compound layer described below is formed in the gap region G between the compressive stress pattern 170 and the spacer structure 145, a leakage current may increase. For inhibiting the increase of the leakage current, a second silicon oxide layer 160 may be formed to fill the gap region G. That is, the second silicon oxide layer 160 may be disposed on the slope of the compressive stress pattern 170 that protrudes upwardly from the substrate 100. The second silicon oxide layer 160 may be dry etched using plasma having a strong directivity so as to form the mask oxide layer 161 after the compressive stress pattern 170 is formed.

After the mask oxide layer 161 is formed, a first metal-semiconductor compound layer 175a is formed on the substrate 100 in the first transistor region 10, and a second metal-semiconductor compound layer 175b is formed on the compressive stress pattern 170 in the second transistor region 20. The first metal-semiconductor compound layer 175a may be a metal-silicide when the substrate 100 is a silicon substrate. The second metal-semiconductor compound layer 175b may be a metal-silicon-germanium compound when the compressive stress pattern 170 is formed of silicon-germanium.

The first and second metal-semiconductor compound layers 175a, 175b may be spaced apart from the spacer structure 145 because of the mask oxide layer 161. For example, the distance d1 from a channel region in the first transistor region 10 to the first metal-semiconductor compound layer 175a may be greater than a distance d2 between the channel region and the sidewall of the spacer structure 145. Hereinafter, throughout the specification, the distance means the distance along the direction parallel to the upper surface of the substrate 100 unless otherwise indicated. The bottom portion 143b of the third spacer 143 may be spaced apart from the second metal-semiconductor compound layer 175b horizontally and vertically. A cleaning process may be performed before the metal-semiconductor compound layers 175a, 175b are formed. A portion of the mask oxide layer 161 may be removed by the cleaning process so that the mask oxide layer 161 may cover a portion of the sidewall of the fourth spacer 144 as shown in FIG. 6. A natural oxide layer 176 may be formed on the metal-semiconductor compound layers 175a, 175b after the metal-semiconductor compound layers 175a, 175b are formed.

Figure 7:
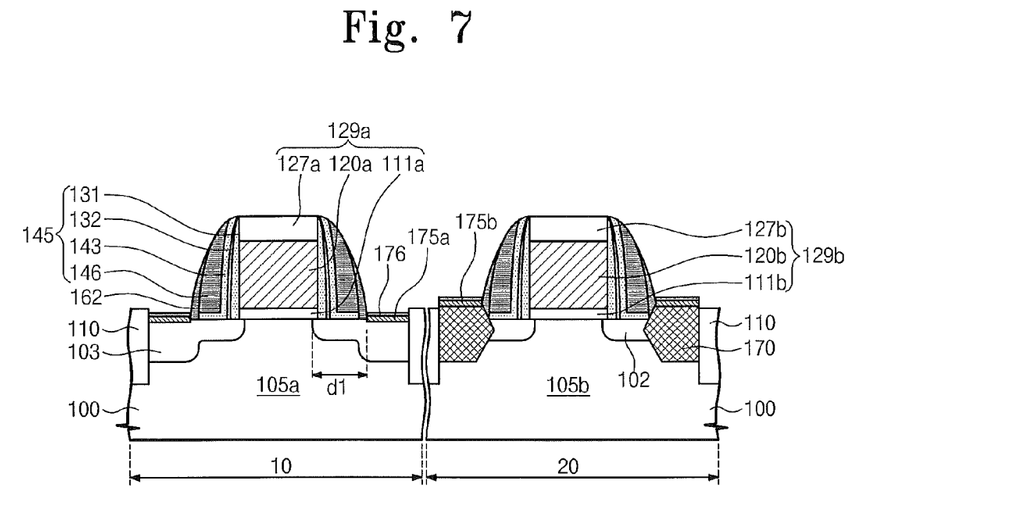

Referring to FIG. 7 and FIG. 14, a predetermined source gas is injected to a chamber (S1). The mask oxide layer 161 may be changed to a silicon fluoride layer (S2). The silicon fluoride layer may be a first ammonium fluorosilicate ($(NH_4)_xSiF_y$) layer 162. For example, the mask oxide layer 161 may be changed to a first ammonium fluorosilicate layer 162 by the source gas including $NH_3$. The source gas may include HF and/or $NF_3$. More specifically, the changing process may be described as the following chemical reaction using the source gas including $NH_3$ and HF.

[Chemical Formula 1]

$$SiO_2 + 4HF \rightarrow SiF_4 + 2H_2O \quad (1)$$

$$SiF_4 + 2NH_3 + 2HF \rightarrow (NH_4)2SiF_6 \quad (2)$$

In contrast, the process may be described as the following chemical reaction using the source gas including $NH_3$ and $NF_3$.

[Chemical Formula 2]

$$NF_3 + NH_3 \rightarrow NH_4F + NH_4F.HF \quad (3)$$

$$NH_4F + SiO_2 \rightarrow (NH_4)_2SiF_6 + H_2O \quad (4\text{-}1)$$

$$NH_4F.HF + SiO_2 \rightarrow (NH_4)_2SiF_6 + H_2O \quad (4\text{-}2)$$

The reaction (3) may be a reaction using the source gas in plasma state. In contrast, the source gas in reaction (1) may not be in plasma state. The reactions (4-1) and (4-2) may be occur together, or one of the reactions (4-1) and (4-2) may be occur selectively. The reactions (4-1) and/or (4-2) may be performed below about 50° C.

At least a portion of the fourth spacer 144 may be changed together with the mask oxide layer 161 when the fourth spacer 144 is silicon oxide layer. In this case, the fourth spacer 144 may be changed to a second ammonium fluorosilicate layer 146. Moreover, the natural oxide layer 176 may be fluoridated too.

Figure 8:
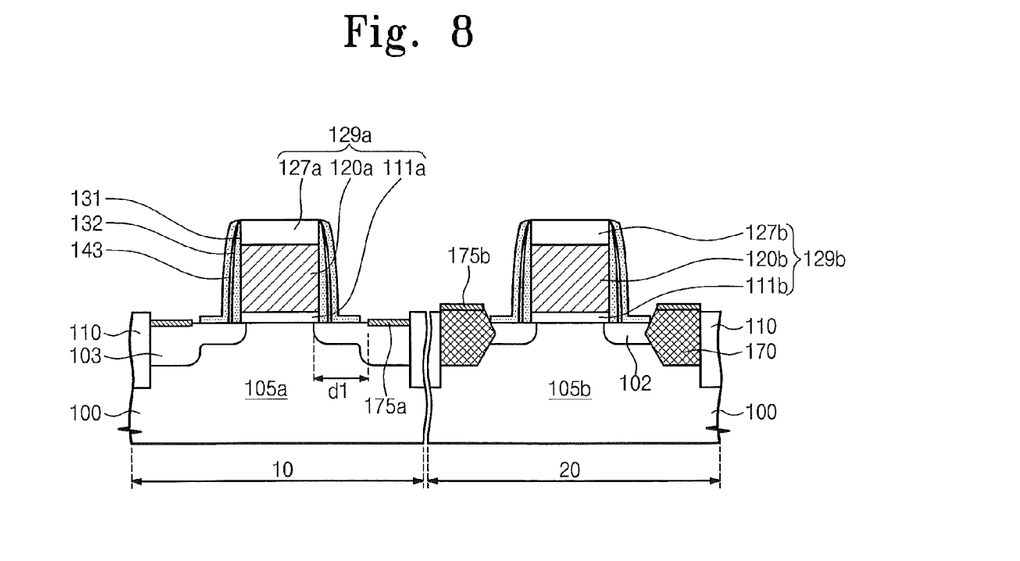

Referring to FIG. 8 and FIG. 14, the first and second ammonium fluorosilicate layers 162, 146 of FIG. 7 may be removed. The removing process may include sublimating the first and second ammonium fluorosilicate layers 162, 146 in high temperature (S3). For example, the sublimation process may include heat treatment at about 100° C. to about 200° C. The heat treatment may be performed in-situ. The sublimation process may be described by the following chemical formula.

[Chemical Formula 3]

$$(NH_4)_2SiF_6(s) \rightarrow SiF_4(g) + NH_3(g) + HF(g) \quad (5)$$

The natural oxide layer 176 may be removed together by the above process. Although it is not described in the figures, a portion of the other silicon oxide layers exposed on the substrate 100 may be removed by the fluoridation process and the removing process.

In contrast to an etching process, the removing process may remove the mask oxide layer 161 and the fourth spacer 144 without damaging the metal-semiconductor compound layers 175a, 175b. Wet etching process may generate the etching damage on the metal-semiconductor compound layer 175a, 175b by the chemical reaction between the metal-semiconductor compound layer 175a, 175b and the etchant. Dry etching may have low etching selectivity, may need a masking process, and/or may need additional following ashing process, etc. In the removing process according to embodiments of the present inventive concept, the oxide layers are changed to the fluoride layers selectively, and removed by the sublimation process. So, the mask oxide layer 161 and the fourth spacer 144 are removed without damaging the metal-semiconductor compound layers 175a, 175b.

Figure 9:
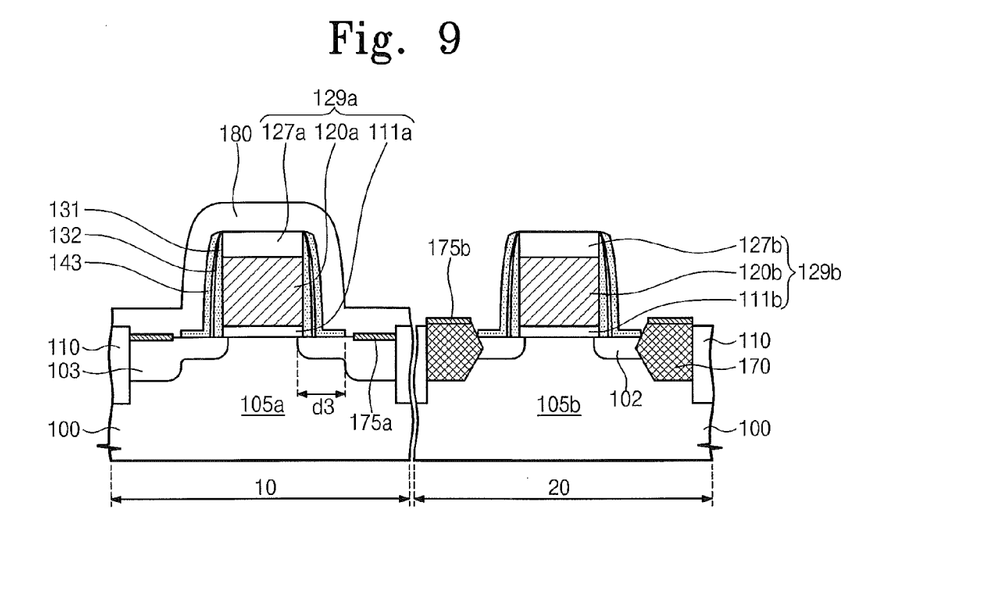

Referring to FIG. 9 and FIG. 6, a tensile stress pattern 180 may be formed in the first transistor region 10. The tensile stress pattern 180 may include a silicon nitride layer having lower density than a common silicon nitride layer. For example, a silicon nitride layer may be formed in the first transistor region 10, and its density may be changed by ultra-violet rays so as to generate tensile stress. Alternatively, the tensile stress pattern 180 may be formed by surface treatment using gas replacing the nitrogen in the silicon nitride with oxygen. The tensile stress pattern 180 may not be placed in the second transistor region 20 as shown. For example, the tensile stress pattern 180 may be formed both in the first and second transistor regions 10, 20, and removed from the second transistor region 20.

Effect of improving the carrier mobility may be increased as the tensile stress pattern 180 becomes closer to the channel region. According to an embodiment of the present inventive concept, the distance d3 from the tensile stress pattern 180 to the channel region may be decreased when the mask oxide layer 161 of FIG. 6 is removed comparing with the distance d1 in FIG. 6 from the channel region to the tensile stress pattern 180 when the mask oxide layer 161 is not removed. Moreover, the fourth spacer 144 may also be removed together with the mask oxide layer 161 so that the tensile stress pattern 180 and the third spacer 143 may directly contact each other. The third spacer 143 may have a "L" shape so that the third spacer 143 may have a relatively thinner thickness than that of the fourth spacer 144. The tensile stress pattern 180 formed on the sidewall of the first dummy gate pattern 129a may be closer to the channel region. The increase of the carrier mobility in the channel region resulted from the tensile stress pattern 180 may be increased more, so that the electrical characteristics may be improved.

Figure 10:
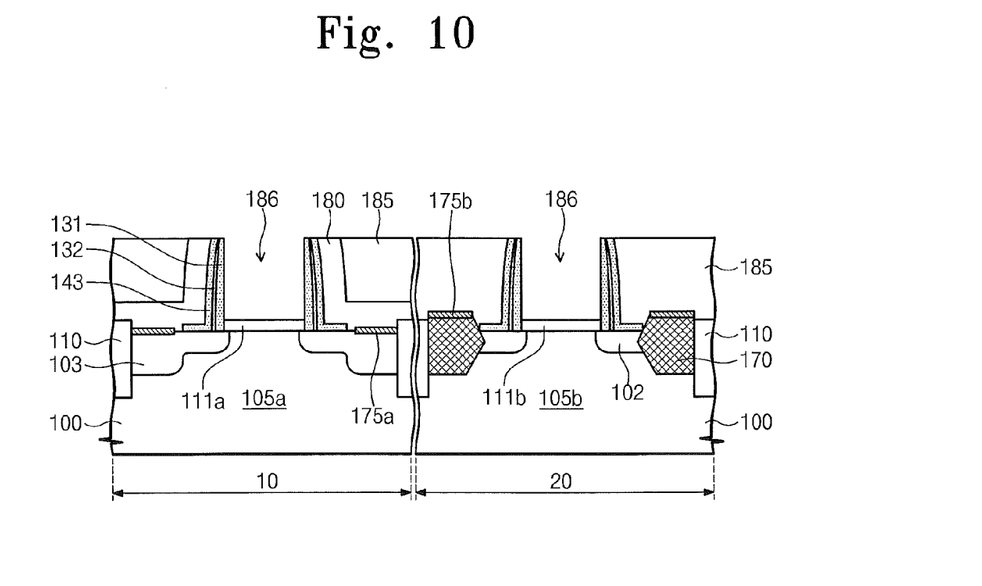

Referring to FIG. 10 with FIG. 9, the first and second dummy gate electrodes 120a, 120b, and the first and second dummy hard mask patterns 127a, 127b may be removed. The removal process may include forming an interlayer dielectric layer 185 covering the substrate 100, and exposing the first and second dummy hard mask patterns 127a, 127b by a planarization process. An opening 186 may be formed by removing the first and second dummy gate electrodes 120a, 120b, and the first and second dummy hard mask patterns 127a, 127b.

Figure 11:
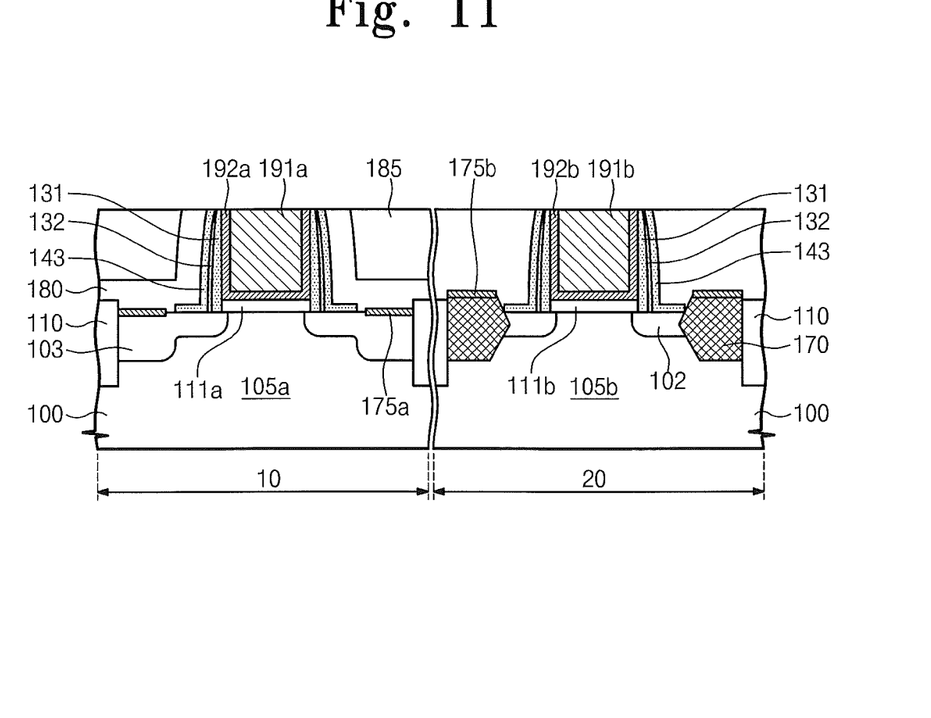

Referring to FIG. 11 with FIG. 10, first and second barrier patterns 192a, 192b and first and second gate electrodes 191a, 191b may be formed in the opening 186. A barrier layer (not shown) and a gate electrode layer (not shown) may be formed on the substrate 100 sequentially and planarized to expose the interlayer dielectric layer 185 so as to form the first and second barrier patterns 192a, 192b and the first and second gate electrodes 191a, 191b. The barrier layer may include a diffusion barrier layer. The diffusion barrier layer may be formed of a conductive metal nitride layer. For example, the diffusion barrier layer may include one or more of titanium nitride, tantalum nitride, and/or tungsten nitride. The gate electrode layer may be a metal layer. For example, the gate electrode layer may include aluminum or copper.

Figure 12:
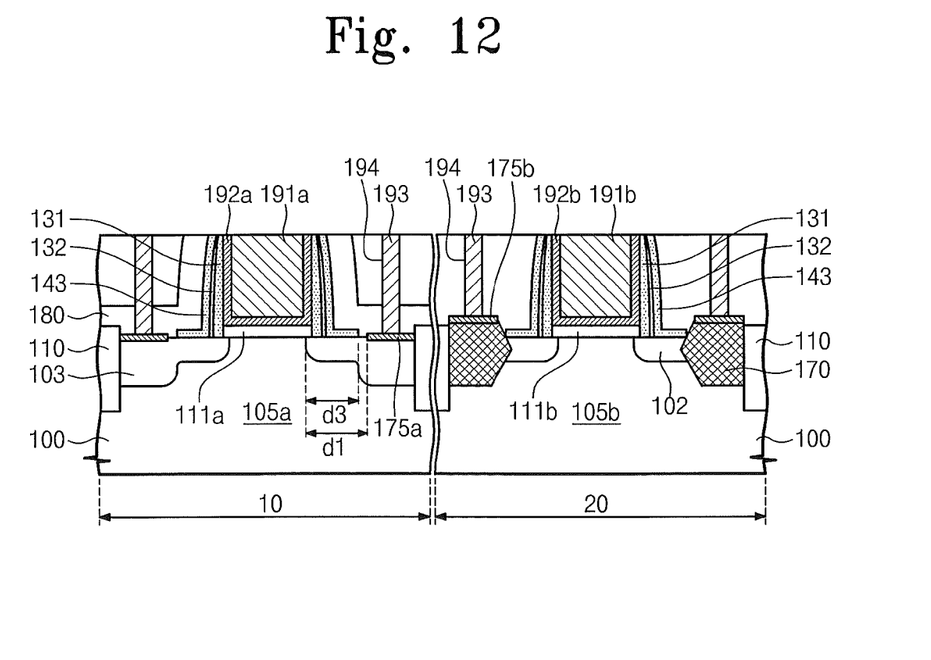

Referring to FIG. 12, a contact plug 193 connected to the metal-semiconductor compound layers 175a, 175b may be formed. A contact hole 194 may be formed and filled with a conductive material so as to form the contact plug 193. The contact plug 193 may include one or more of tungsten, aluminum, and/or copper. The third spacer 143 may protect the active portions 105a, 105b when the contact hole 194 is misaligned. The tensile stress pattern 180 may be used as a etch stop layer when forming the contact hole.

According to an embodiment of the inventive concept, the mask oxide layer 161 and the fourth spacer 144 of FIG. 6 may be removed without damaging the metal-semiconductor compound layers 175a, 175b. Moreover, the distance between the tensile stress pattern 180 and the channel region may be decreased so that the carrier mobility may be increased more.

FIG. 13 is a cross-sectional view illustrating a semiconductor device and methods of fabricating the semiconductor device according to further embodiments of the present inventive concept. For brevity of description, the description of the same technical matter and structure as illustrated in FIGS. 1-12 will be omitted.

In the embodiments of FIG. 13, a plurality of transistors may be disposed on the first and second transistor regions 10, 20. The plurality of transistors may share a source/drain region. For example, the semiconductor device of the second embodiment may be a SRAM. A void may occur in the interlayer dielectric layer 185 between transistors when the plurality of transistors share a source/drain region. In particular, this phenomenon may be increased as the integration density of semiconductor device increases. Moreover, the possibility of the occurrence of a void may be increased more when the tensile stress pattern 180 is present between the transistors. According to some embodiments of the present inventive concept, the interlayer dielectric layer 185 may be formed without voids between the transistors.

A compressive stress pattern 170 may be disposed in the region between the gates in the second transistor region 20. The compressive stress pattern 170 may be formed to have a substantially hexagonal shape vertical cross section through the process described above. Although all the sides of the hexagon are described as not to overlap the bottom portion of the first spacer 131 in FIG. 13, some of the sides of the hexagonal may overlap the bottom portion of the first spacer 131.

In contrast to the first embodiment, the tensile stress pattern 180 may be formed in the second transistor region 20. The tensile stress pattern 180 formed in the second transistor region 20 may be used as an etch stop layer when the contact hole for the contact plug 193 is formed. The tensile stress pattern 180 may not prevent an increase in the carrier mobility in the second transistor region 20, because the compressive stress pattern 170 is already disposed on the second transistor region 20.

In contrast to the embodiments illustrated in FIGS. 1-12, the first spacer 131 may have "L" shape having a sidewall portion and a bottom portion. In the embodiments of FIG. 13, the second and third spacers 132, 143 in the first embodiment may not be present, and the fourth spacer (not shown) including silicon oxide may be formed directly on the first spacer 131. A mask spacer (not shown) and the fourth spacer may be removed by the process described in FIG. 14. In the removing process, a portion of the second ammonium fluorosilicate layer 146 may remain on the first spacer 131. In particular, the second ammonium fluorosilicate layer 146 may remain in the cross section area between the sidewall portion and the bottom portion.

In contrast, a portion of the fourth spacer may be not changed to the second ammonium fluorosilicate layer 146, and may remain as an oxide layer. In this case, a silicon oxide layer may remain on the first spacer 131 after the removal process described as S3.

Fluorine atoms may be diffused to a portion of the first spacer 131 in the fluoridation process. In this case, a concentration of the fluorine atoms in the portion of the first spacer 131 may be decreased as it is farther from the tensile stress pattern 180.

The semiconductor device according to the embodiments of the present inventive concept may be packaged using various types of packages. For example, the semiconductor device according to the inventive concept may be packaged using packages such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

The package including the semiconductor device according the embodiments of the inventive concept may further include the other semiconductor device (e.g., controller, memory device, and/or hybrid device, etc) performing other functions.

Figure 15:
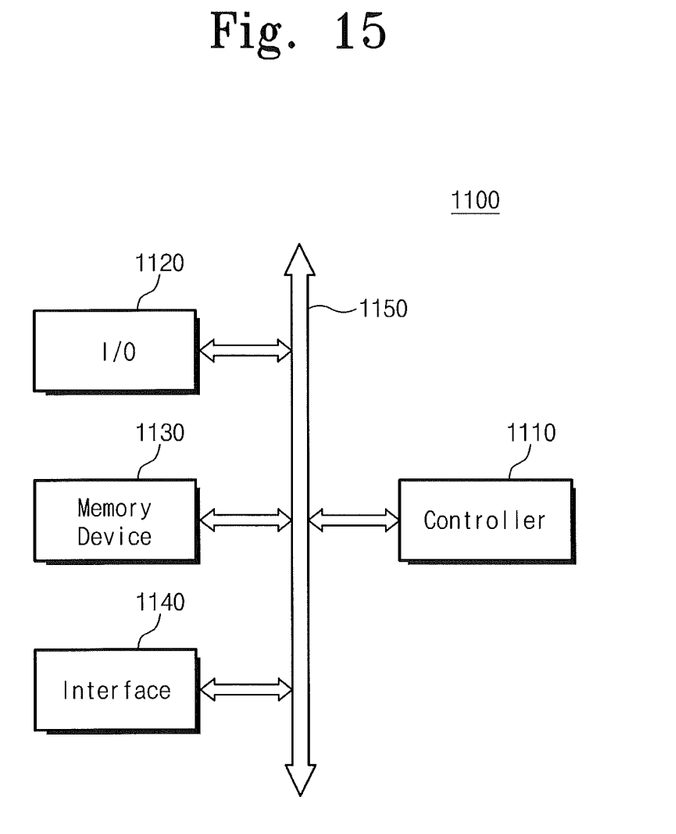
FIG. 15 is an electronic system including a semiconductor device according to the embodiments of the present inventive concept.

FIG. 15 is a schematic block diagram illustrating an example of a memory system including a semiconductor memory device according to embodiments of the inventive concept.

Referring to FIG. 15, an electronic system 1100 in accordance with exemplary embodiments of the inventive concept may include a controller 1110, an input/output device 1120, a memory device 1130, an interface 1140 and a bus 1150. The controller 1110, the input/output device 1120, the memory device 1130 and the interface 1140 may be combined with one another through the bus 1150. The bus 1150 corresponds to a path through which data transfer.

The controller 1110 may include at least one of a micro processor, a digital signal processor, a microcontroller or a logic device having a function similar to the micro processor, the digital signal processor and the microcontroller. The input/output device 1120 may include a keypad, a keyboard, a display device, etc. The memory device 1130 may store data and/or an instruction. The memory device 1130 may include at least one of semiconductor memory devices disclosed in first or second embodiments described above. The memory device 1130 may further include a different type of semiconductor memory device (e.g., a flash memory device, a DRAM device and/or a SRAM device). The interface 1140 may perform a function of transmitting data to a communication network or receiving data from a communication network. The interface 1140 may be a wireline type and or a wireless type. The interface 1140 may include an antenna or a wireline/wireless transceiver. Although not illustrated in the drawing, the electronic system 1100 may further include a high speed DRAM and/or a SRAM as an operation memory to improve an operation of the controller 1110.

The electronic system 1100 may be applied to a personal digital assistant (PDA), a portable computer, a web tablet, a wireless phone, a mobile phone, a digital music player, a memory card or all the devices that can transmit and/or receive data in a wireless environment.

According to the embodiments of the inventive concept, a mask oxide layer and a portion of a spacer may be removed without damaging the silicide layer. The leakage current may be decreased when forming the silicide layer in a PMOS transistor region. A distance between a tensile stress pattern and a channel region may be decreased so that electrical characteristics of a semiconductor device may be improved. An interlayer dielectric layer may be formed without having a void between adjacent transistors.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents. Therefore, the above-disclosed subject matter is to be considered illustrative, and not restrictive.

What is claimed is:

1. A method of fabricating a semiconductor device, the method comprising:
    forming gate patterns in an NMOS transistor region and a PMOS transistor region of a substrate;
    forming a spacer structure on sidewalls of the gate patterns;
    etching the substrate in the PMOS transistor region using the gate patterns and the spacer structure as etching masks, thereby forming a recessed region;
    forming a compressive stress pattern in the recessed region, wherein a sidewall of the compressive stress pattern protrudes upwardly from an upper surface of the substrate;
    forming a mask oxide layer on a sidewall of the spacer structure, wherein the mask oxide layer covers a portion of the sidewall of the compressive stress pattern that protrudes upwardly from the upper surface of the substrate;
    forming a metal-semiconductor compound layer on the compressive stress pattern; and
    removing the mask oxide layer from the sidewall of the spacer structure after forming the metal-semiconductor compound layer.

2. The method of claim 1, wherein an upper surface of the compressive stress pattern is higher than the upper surface of the substrate, and the sidewall of the compressive stress pattern is declined from the upper surface of the compressive stress pattern toward the gate patterns.

3. The method of claim 1, further comprising:
    wherein removing the mask oxide layer comprises:
    transforming the mask oxide layer into a first ammonium fluorosilicate layer; and
    removing the first ammonium fluorosilicate layer.

4. The method of claim 3, wherein transforming the mask oxide layer into the first ammonium fluorosilicate layer is performed by exposing the mask oxide layer to a source gas including $NH_3$, and wherein the source gas further comprises at least one of HF or $NF_3$.

5. The method of claim 3, wherein removing the first ammonium fluorosilicate layer comprises annealing the substrate having the first ammonium fluorosilicate layer at a temperature of about 100° C. to about 200° C.

6. The method of claim 3, wherein forming the spacer structure comprises sequentially forming a first nitride layer and a first oxide layer on the sidewalls of the gate patterns;
    wherein the first nitride layer comprises a sidewall portion extending along a sidewall of the first oxide layer and a bottom portion extending between the upper surface of the substrate and a lower surface of the first oxide layer.

7. The method of claim 6, wherein forming the spacer structure further comprises:
forming a second nitride layer between the gate patterns and the first nitride layer; and
forming a second oxide layer between the first nitride layer and the second nitride layer.

8. The method of claim 3, further comprising forming a tensile stress pattern on the substrate after removing the mask oxide layer.

9. A method of fabricating a semiconductor device, the method comprising:
forming a gate pattern on a substrate;
forming spacers on sidewalls of the gate pattern;
etching the substrate adjacent the gate pattern using the gate pattern and the spacers as an etching mask, thereby forming recessed regions in the substrate adjacent the gate pattern;
forming compressive stress patterns in the recessed regions, wherein sidewalls of the compressive stress patterns facing the gate pattern protrude upwardly from an upper surface of the substrate;
forming a mask layer on sidewalls of the spacers and on the portions of the sidewalls of the compressive stress patterns that protrude upwardly from an upper surface of the substrate;
forming metal-semiconductor layers on the compressive stress patterns; and
removing the mask layer from the sidewalls of the spacers after forming the metal-semiconductor layers.

10. The method of claim 9, wherein forming the mask layer comprises forming a preliminary mask layer on the sidewalls of the spacers and on the compressive stress patterns, and selectively removing a portion of the preliminary mask layer from upper surfaces of the compressive stress patterns, and wherein forming the metal-semiconductor layers on the compressive stress patterns comprises forming the metal-semiconductor layers on the upper surfaces of the compressive stress patterns.

11. The method of claim 10, wherein the spacers comprise first spacers on the gate pattern and second spacers on the first spacers, wherein the first spacers comprise a nitride and wherein the second spacers and the mask layer comprise oxides.

12. The method of claim 11, further comprising transforming the mask layer into a first ammonium fluorosilicate layer, and transforming the second spacers into a second ammonium fluorosilicate layer, and removing the first ammonium fluorosilicate layer and the second ammonium fluorosilicate layer.

13. The method of claim 9, further comprising forming source/drain extensions in the substrate beneath the spacers, wherein the compressive stress patterns contact the source/drain extensions.

* * * * *